(12) United States Patent
Sato

(10) Patent No.: US 8,652,949 B2
(45) Date of Patent: Feb. 18, 2014

(54) METHOD OF MANUFACTURING SEMICONDUCTOR WAFER

(75) Inventor: Ken Sato, Saitama (JP)

(73) Assignee: Sanken Electric Co., Ltd., Saitama-ken (JP)

( * ) Notice: Subject to any disclaimer, the term of this patent is extended or adjusted under 35 U.S.C. 154(b) by 375 days.

(21) Appl. No.: 13/204,273

(22) Filed: Aug. 5, 2011

(65) Prior Publication Data

US 2012/0034768 A1     Feb. 9, 2012

(30) Foreign Application Priority Data

Aug. 5, 2010    (JP) .................................. 2010-175830

(51) Int. Cl.
     *H01L 21/20*          (2006.01)
(52) U.S. Cl.
     USPC ............ 438/483; 438/572; 438/590; 438/602
(58) Field of Classification Search
     USPC ........... 438/46, 483, 572, 584, 590, 602–604; 257/618, 626, 627, 629, 631
     See application file for complete search history.

(56) References Cited

U.S. PATENT DOCUMENTS 7,638,439 B2 *   12/2009   Kubota et al. ................. 438/770

FOREIGN PATENT DOCUMENTS

JP       2009-256154      11/2009

* cited by examiner

*Primary Examiner* — Hsien Ming Lee
(74) *Attorney, Agent, or Firm* — Wilmer Cutler Pickering Hale and Dorr LLP

(57) ABSTRACT

A method of manufacturing a semiconductor wafer, which includes: a semiconductor substrate made of silicon and having both a central area and an outer periphery area; and a compound semiconductor layer made of a nitride-based semiconductor and formed on the semiconductor substrate, the method comprising: forming a growth inhibition layer to inhibit the compound semiconductor layer from growing on a tapered part provided in the outer periphery area of the semiconductor substrate; and growing the compound semiconductor layer on at least the central area of the semiconductor substrate, after the growth inhibition layer has been formed.

5 Claims, 2 Drawing Sheets

METHOD OF MANUFACTURING SEMICONDUCTOR WAFER

CROSS-REFERENCE TO RELATED APPLICATION

This application claims priority from Japanese Patent Application No. 2010-175830 filed on Aug. 5, 2010, the entire subject matter of which is incorporated herein by reference.

BACKGROUND

The present invention relates to a method of manufacturing a semiconductor wafer having a compound semiconductor layer formed on a silicon substrate.

JP-A-2009-256154 discloses a method of manufacturing a semiconductor wafer. In order to form a semiconductor layer having less crystal defect, the method forms: a protective film, which is made of silicon nitride and has a film thickness of about 100 nm, on at least an outer periphery side of a substrate, which is made of silicon, for semiconductor crystal growth; a buffer layer, which is made of aluminum nitride, on an area that the protective film is not formed in a surface of the substrate for semiconductor crystal growth; and a semiconductor layer, which is made of gallium nitride, on the buffer layer.

According to the method of manufacturing a semiconductor wafer disclosed in JP-A-2009-256154, in the crystal growth steps of the buffer layer and the semiconductor layer, it is possible to suppress a crack generated in the outer periphery area of the substrate for semiconductor crystal growth by stress concentration due to distortion, so that it is possible to suppress that gallium is introduced into the substrate for semiconductor crystal growth

SUMMARY

However, the method of manufacturing a semiconductor wafer does not have an object of decreasing the stress that is generated in the substrate for semiconductor crystal growth and the semiconductor layer. Accordingly, a crack due to the stress may be generated in the outer periphery region of the semiconductor wafer.

In consideration of the above, the present invention provides a method of manufacturing a semiconductor wafer to suppress a crack to be generated in an outer periphery area of the semiconductor wafer.

The inventor studied a method of manufacturing a semiconductor wafer to suppress a crack to be generated in an outer periphery area of the semiconductor wafer and found out that the crack was generated by a compound semiconductor layer growing at a tapered part provided in the outer periphery area of the semiconductor wafer. Then, the inventor found out that it is possible to suppress the crack to be generated in the outer periphery area of the semiconductor wafer by forming a growth inhibition layer to inhibit the compound semiconductor layer from growing on the tapered part.

According to an illustrative aspect of the present invention, a method of manufacturing a semiconductor wafer, which comprises: a semiconductor substrate made of silicon and having both a central area and an outer periphery area; and a compound semiconductor layer made of a nitride-based semiconductor and formed on the semiconductor substrate, the method comprising: forming a growth inhibition layer to inhibit the compound semiconductor layer from growing on a tapered part provided in the outer periphery area of the semiconductor substrate; and growing the compound semiconductor layer on at least the central area of the semiconductor substrate, after the growth inhibition layer has been formed.

According to the illustrative aspect, it is possible to provide a method of manufacturing a semiconductor wafer to suppress a crack to be generated in an outer periphery area of the semiconductor wafer.

DETAILED DESCRIPTION OF THE PRESENT INVENTION

Figure 1A:
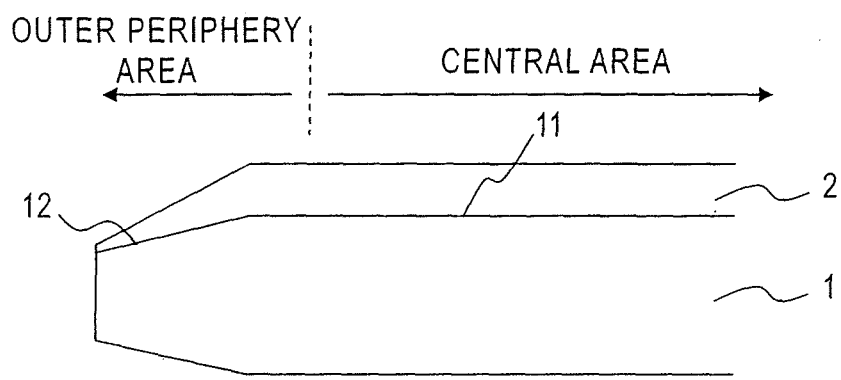
FIGS. 1A to 1D are sectional views illustrating processes in a method of manufacturing a semiconductor wafer according to a first illustrative embodiment.

Hereinafter, a method of manufacturing a semiconductor wafer according to the illustrative embodiments of the present invention will be specifically described with reference to the drawings. In the following descriptions, the same or similar parts are indicated with the same reference numerals. The drawings are illustrative drawings and may be different from the actual object. Also, the sizes or scales of the parts may be different from each drawings.

First Illustrative Embodiment

A semiconductor wafer and a method of manufacturing the same according to a first illustrative embodiment will be described with reference to the drawings. FIGS. 1A to 1D are sectional views illustrating processes in a method of manufacturing a semiconductor wafer according to a first illustrative embodiment. A semiconductor wafer according to this illustrative embodiment has a semiconductor substrate 1, a growth inhibition layer 4 formed on a tapered part 12 of the semiconductor substrate 1, and a compound semiconductor layer 5 formed on the semiconductor substrate 1. A method of manufacturing the semiconductor wafer according to the first illustrative embodiment includes: forming the growth inhibition layer 4 on the tapered part 12 provided in an outer periphery area of the semiconductor substrate 1 and growing the compound semiconductor layer 5 on the semiconductor substrate 1 having the growth inhibition layer 3 formed thereon.

The method of manufacturing the semiconductor wafer according to this illustrative embodiment is described with reference to FIGS. 1A to 1D. First, as shown in FIG. 1A, the semiconductor substrate 1 is prepared, and then a protective film 2 is formed on a surface of a planar part (main surface) 11 and a tapered part 12 of the semiconductor substrate 1. The semiconductor substrate 1 made of silicon. In a plan view, the semiconductor substrate 1 has a central area, in which the surface is mirror-processed and a semiconductor device is to be formed, and an outer periphery area, which is provided as a holding part when conveying the wafer. The central area is provided in the planer part 11, and the outer periphery area includes the tapered area 12 and a part of the planer area 11. The tapered part 12 is formed to have a predetermined angle with respect to the planar part 11. The protective film 2 is made of a material, on which a compound semiconductor does not grow, such as silicon oxide (SiOx) and silicon nitride (SiNx). The protective film 2 is formed by Spin-on-glass (SOG) method, the chemical vapor deposition (CVD)

method, vapor deposition and thermal oxidation methods, for example. In this illustrative embodiment, the protective film is made of SiOx and is formed by the thermal oxidation method. The protective film 2 is formed on the surfaces of the planar part 11 and the tapered part 12 so as to has a thickness of about several tens to several hundreds micro meters.

Figure 1B:
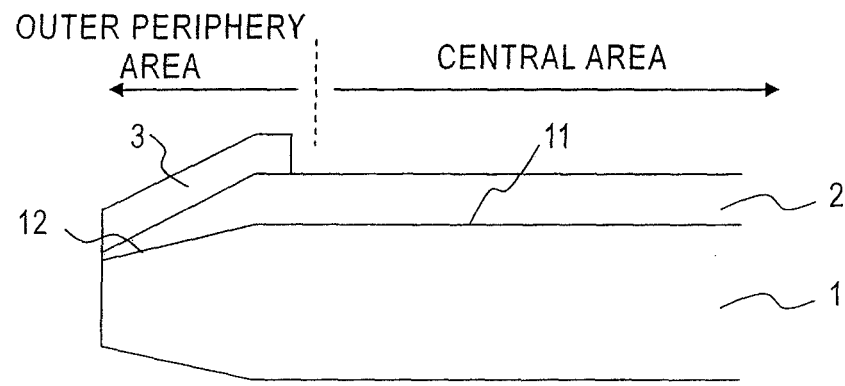

Then, as shown in FIG. 1B, a mask 3 is formed on the protective film 2 in the outer periphery area of the semiconductor substrate 1. The mask 3 is made of photoresist material and is formed by the well-known photolithography method. The mask 3 is provided at a position, at which a growth inhibition layer 4 is to be formed, and The mask 3 is formed to cover at least the tapered part 12 of the semiconductor substrate 1.

Figure 1C:
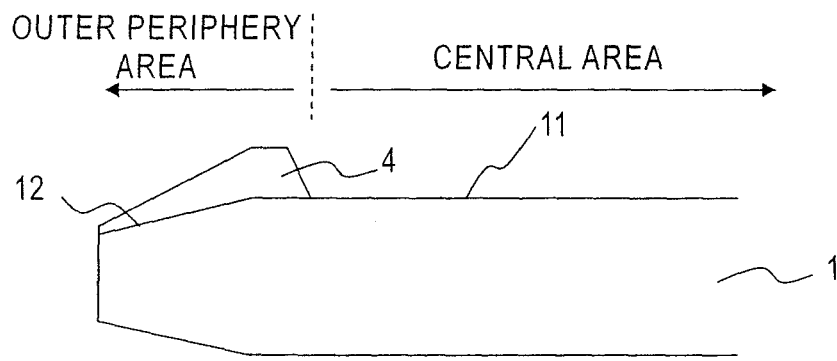

Subsequently, as shown in FIG. 1C, the growth inhibition layer 4 is formed in the outer periphery area of the semiconductor substrate 1. The growth inhibition layer 4 is formed by patterning the protective film 2, on which the mask 3 is formed, by the well-known wet etching or dry etching and then removing the mask 3. The growth inhibition layer 4 has a predetermined width from an outer periphery end portion of the semiconductor substrate 1 toward the central area thereof. The growth inhibition layer 4 is formed to cover at least the surface of the tapered part 12 of the semiconductor substrate 1. The growth inhibition layer 4 may be formed to further cover a part of the planar part 11 of the semiconductor substrate 1.

Figure 1D:
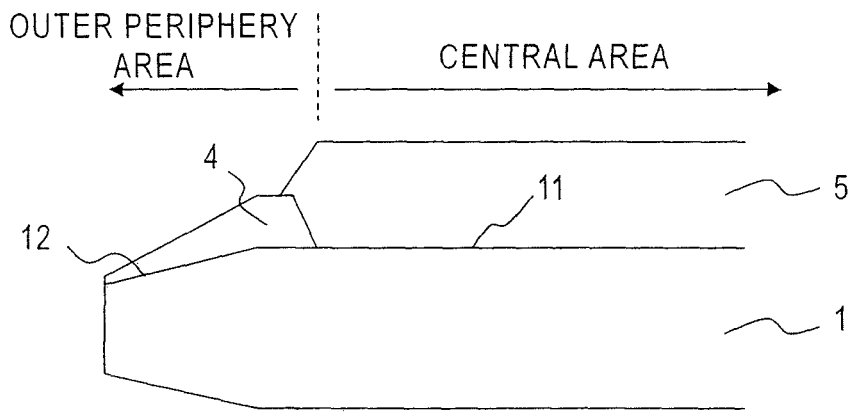

Then, as shown in FIG. 1D, a compound semiconductor layer 5 is grown on the semiconductor substrate 1 having the growth inhibition layer 4 formed thereon. The compound semiconductor layer 5 is made of gallium nitride (GaN), aluminum gallium nitride (AlGaN), indium nitride (InN) or III-V compound semiconductor including mixed crystals thereof. In this illustrative embodiment, the compound semiconductor layer has a single layer or multilayer structure that has a composition represented by $Al_xGa_{1-x}N$ ($0 \leq x \leq 1$). The compound semiconductor layer 5 is formed on at least the central area of the planar part 11 of the semiconductor substrate 1 by the CVD or molecular beam epitaxy (MBE). In the step of forming the compound semiconductor layer 5, the compound semiconductor layer 5 may be grown not only in a film thickness direction (a vertical direction in FIG. 1D) but also in a width direction (a horizontal direction in FIG. 1D), so that it may be formed on the growth inhibition layer 4.

In the method of the semiconductor wafer according to the related art, since a crystal orientation of the tapered part 12 is different from that of the planar part 11, a compound semiconductor layer based on the crystal orientation of the planar part 11 and a compound semiconductor layer based on the crystal orientation of the tapered part 12 are grown on the semiconductor substrate 1. Accordingly, the compound semiconductor layer formed on the tapered part 12 has the crystal orientation, crystallinity, growth rate and the like different from those of the compound semiconductor layer on the planar part 11. Therefore, the stress is easily generated in the vicinity of the tapered part 12. Alternatively, the stress is easily generated at an interface between the compound semiconductor layer on the planar part 11 and the compound semiconductor layer on the tapered part, so that a crack is generated in the outer periphery area of the semiconductor wafer.

However, according to the method of manufacturing the semiconductor wafer of this illustrative embodiment, the compound semiconductor layer 5 is formed except for at least the surface of the tapered part 12 of the semiconductor substrate 1. Thereby, since the uniform compound semiconductor layer 5 is grown based on the crystal orientation (for example, Miller index (111) plane) of the planar part 11, the stress is difficult to be generated in the outer periphery area of the semiconductor wafer. Accordingly, it is possible to suppress the crack to be generated in the outer periphery area of the semiconductor wafer.

Second Illustrative Embodiment

Figure 2A:
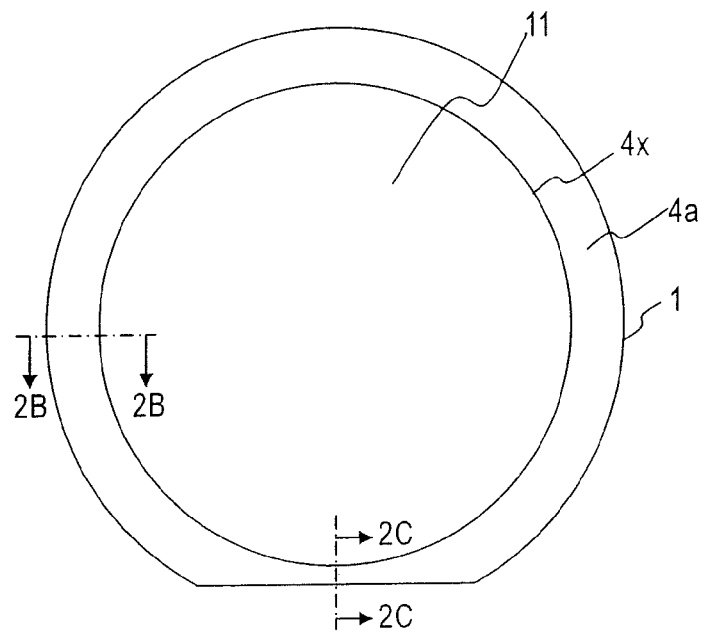
FIGS. 2A to 2C are views illustrating a structure of a semiconductor wafer according to a second illustrative embodiment.
Figure 2B:
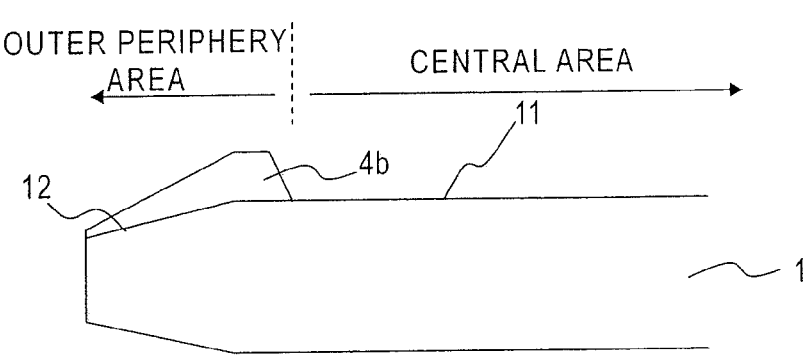
Figure 2C:
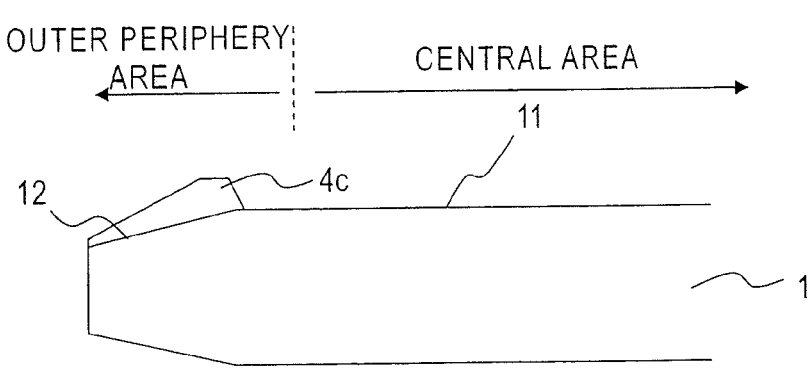

FIGS. 2A to 2C are views illustrating a structure of a semiconductor wafer according to a second illustrative embodiment. An inner periphery of the growth inhibition layer in the first illustrative aspect is parallel with an outer periphery of the semiconductor substrate (not shown). The semiconductor wafer of the second illustrative embodiment is different from the semiconductor wafer of the first illustrative embodiment, in that an inner periphery 4x of a growth inhibition layer 4a is formed to be circular. The others are the substantially same. In the meantime, FIG. 2A is a plan view of the semiconductor wafer of this illustrative embodiment, FIG. 2B is a sectional view taken along a line 2B-2B of FIG. 2A and FIG. 2C is a sectional view taken along a line 2C-2C of FIG. 2A.

As shown in FIG. 2A, the semiconductor substrate 1 has a shape referred as an orientation-flat (OF) part, so that an outer periphery end portion thereof is not circular. The growth inhibition layer 4a of the second illustrative embodiment has a part of an inner periphery that is not parallel with the outer periphery end portion of the semiconductor substrate 1, and a part opposed to the OF part of the inner periphery is also formed to be circular. Specifically, as shown in FIGS. 2B and 2C, a width of a growth inhibition layer 4c in the vicinity of the OF part is different from a width of a growth inhibition layer 4b in the other parts. The growth inhibition layer 4c in the vicinity of the OF part covers the surface of the tapered part 12 and is formed to be narrower than a width of the growth inhibition layer 4b.

According to the method of manufacturing the semiconductor wafer of the second illustrative embodiment, it is possible to realize the same effects as the method of manufacturing the semiconductor wafer of the first illustrative embodiment. Further, since the compound semiconductor layer 5 is grown to be circular as viewed from a plan view, the stress generated in the outer periphery of the semiconductor wafer is uniformed along the outer periphery. Accordingly, it is possible to suppress the crack generation and the deflection of the semiconductor substrate in the outer periphery area of the semiconductor wafer.

Although the illustrative embodiments of the present invention have been described above, the present invention is not limited thereto. In other words, the illustrative embodiments can be variously changed and modified within the scope of the present invention defined in the claims.

What is claimed is:

1. A method of manufacturing a semiconductor wafer, which comprises: a semiconductor substrate made of silicon and having both a central area and an outer periphery area; and a compound semiconductor layer made of a nitride-based semiconductor and formed on the semiconductor substrate, the method comprising:

forming a growth inhibition layer to inhibit the compound semiconductor layer from growing on a tapered part provided in the outer periphery area of the semiconductor substrate; and growing the compound semiconductor layer on at least the central area of the semiconductor substrate, after the growth inhibition layer has been formed.

2. The method according to claim 1,
wherein, in forming the growth inhibition layer, the growth inhibition layer is formed to extend from the tapered part in the outer periphery area of the semiconductor substrate toward a planar part of the semiconductor substrate.

3. The method according to claim 1,
wherein, in forming the growth inhibition layer, the growth inhibition layer is formed so that at least a part of an inner periphery of the growth inhibition layer is not parallel with an outer periphery of the semiconductor substrate, in a plan view.

4. The method according to claim 1,
wherein, in forming the growth inhibition layer, the growth inhibition layer is formed so that an inner periphery of the growth inhibition layer is circular, in a plan view.

5. The method according to claim 1,
wherein, in growing the compound semiconductor layer, the compound semiconductor layer is to be grown based on a crystal orientation of a planer part in the central area of the semiconductor substrate, and
wherein, in growing the compound semiconductor layer, the compound semiconductor layer is to not be grown based on a crystal orientation of the tapered part of the semiconductor substrate.

* * * * *